United States Patent [19]

Gastinel et al.

[11] Patent Number: 5,283,877
[45] Date of Patent: Feb. 1, 1994

[54] SINGLE IN-LINE DRAM MEMORY MODULE INCLUDING A MEMORY CONTROLLER AND CROSS BAR SWITCHES

[75] Inventors: Jean A. Gastinel, Palo Alto; Shen Wang, Saratoga; Stan Graham, Daly City; Fred Cerauskis, Mountain View; Gil Chesley, Los Altos, all of Calif.

[73] Assignees: Sun Microsystems, Inc., Mountain View, Calif.; Xerox Corporation, Stamford, Conn.

[21] Appl. No.: 554,283

[22] Filed: Jul. 17, 1990

[51] Int. Cl.$^5$ .............................................. G06F 13/00
[52] U.S. Cl. ................................ 395/425; 395/250; 395/275; 395/400; 364/DIG. 1; 364/238.4; 364/243; 364/238
[58] Field of Search ............... 395/800, 725, 275, 425, 395/325, 250; 365/52

[56] References Cited

U.S. PATENT DOCUMENTS

| | | | |
|---|---|---|---|
| 3,761,879 | 9/1973 | Brandsma et al. | 395/325 |
| 4,462,073 | 7/1984 | Grondalski | 364/200 |
| 4,656,605 | 4/1987 | Clayton | 365/52 |
| 4,688,166 | 8/1987 | Schneider | 364/200 |
| 4,727,513 | 2/1988 | Clayton | 365/52 |
| 4,819,152 | 4/1989 | Deerfield et al. | 395/400 |
| 4,821,176 | 4/1989 | Ward et al. | 395/800 |
| 4,982,187 | 1/1991 | Goldstein et al. | 364/200 |
| 4,985,832 | 1/1991 | Grondalski | 395/800 |
| 5,020,020 | 5/1991 | Pomfret et al. | 395/800 |
| 5,055,997 | 10/1991 | Sluijter et al. | 395/325 |
| 5,070,450 | 12/1991 | Holman, Jr. et al. | 395/750 |
| 5,187,780 | 2/1993 | Clark et al. | 395/325 |
| 5,189,665 | 2/1993 | Niehaus et al. | 370/58.1 |

FOREIGN PATENT DOCUMENTS 1532013 11/1978 United Kingdom.
2112551 10/1979 United Kingdom.

OTHER PUBLICATIONS

R. Atac et al., "Crossbar Switch Backplane and its Application", IEEE Transactions on Nuclear Science, vol. 36 No. 1 Feb. 1989 pp. 726–730.

*Primary Examiner*—Lawrence E. Anderson
*Assistant Examiner*—Mehmet Geckil
*Attorney, Agent, or Firm*—Blakely, Sokoloff, Taylor & Zafman

[57] ABSTRACT

A data processing system includes a processor coupled to a system bus. A memory controller is also coupled to the system bus and to a memory bus in communication with a plurality of single in-line memory modules (SIMMs). Each SIMM comprises a plurality of DRAMS coupled to four cross bar switches (CBSs), such that address and data information is provided to the DRAMs through the cross bar switches. Each CBS includes a counter and decoder which controls a multiplexor. The multiplexor is coupled to enable ID logic, and four input registers ($A_R$, $B_R$, $C_R$, $D_R$), such that register $A_R$ is coupled to the output of the multiplexor, and the remaining registers are coupled to the input side of the multiplexor. An input buffer on the CBS is coupled to four input registers ($A'_W$, $B'_W$, $C'_W$, $D_W$). In addition, three of the input registers ($A'_W$, $B'_W$, $C'_W$) are coupled to intermediate input registers $A_W$, $B_W$ and $C_W$. During each refresh cycle of the DRAMs on the SIMM, enable ID logic provides a unique 2-bit ID value to the memory controller, thereby forming an ID byte. (The sum of all ID bits from each CBS.) The ID byte identifies the manufacturer of the DRAMs, their size and speed.

30 Claims, 7 Drawing Sheets

SINGLE IN-LINE DRAM MEMORY MODULE INCLUDING A MEMORY CONTROLLER AND CROSS BAR SWITCHES

BACKGROUND OF THE INVENTION

1. Field of the Invention

The present invention relates to the field of computer memories, and more particularly, to an improved single in-line dynamic random access memory (DRAM) module for storing and retrieving data in a computer system.

2. Art Background

Computer systems commonly utilize banks of dynamic random access memory (DRAM) for storing data and computer programs for a variety of tasks. For example, in a bit map computer display system, each pixel disposed on a cathode ray tube (CRT) display is assigned a single bit digital value to represent the pixel in memory, or a multiple bit digital value to represent color. Computers have traditionally addressed their memories in 8 bit, 16 bit, 32 bit, 64 bit or larger increments. Typically one memory cycle has the capability of transferring a predetermined number of bits. Over the years since the advent of digital computers, a variety of memory configurations and architectures have been developed to maximize the performance of data processing systems. As will be described, the present invention discloses an improved single in-line memory module containing a plurality of DRAMS for use in a digital computing system.

A number of computing systems, such as the engineering workstations manufactured by the assignee of the present application, Sun Microsystems, Inc., have provided dynamic RAM memory through the use of DRAM modules, which plug into the main printed circuit board ("mother board") of the workstation. These DRAM modules provide a known amount of memory per module, with predetermined cycle times and operating modes. For example, a DRAM module offered by the Toshiba Corporation provides 72 megabits, 36 megabits, and other combinations of RAM storage capacity, on printed circuit boards for insertion into memory expansion slots on computer mother boards. However, these prior art DRAM modules provide limited bandwidth for data transfer to and from the processor, and further lack many of the capabilities (such as error correction and control) desirable in modern computer systems.

As will be described, the present invention provides an improved single in-line DRAM memory module which may be used in conjunction with modern engineering workstations or other digital computers. The present invention utilizes unique cross bar switches (CBS) for the multiplexing and pipelining of data. Moreover, the present invention permits the memory controller to conduct error detection and recovery on data stored within the DRAMS.

SUMMARY OF THE INVENTION

An improved single-in-line dynamic RAM memory module is disclosed for use in a data processing system. The data processing system includes a processor coupled to a system bus. A memory controller is also coupled to the system bus and to a memory bus in communication with a plurality of single-in-line memory modules (SIMMs). Each SIMM comprises a plurality of DRAMS coupled to four cross bar switches (CBSs), such that address and data information is provided to the DRAMs through the cross bar switches. Each CBS includes a counter and decoder which controls a multiplexor. The multiplexor is coupled to enable ID logic, and four input registers ($A_R$, $B_R$, $C_R$, $D_R$), such that register $A_R$ is coupled to the output of the multiplexor, and the remaining registers are coupled to the input side of the multiplexor. An input buffer on the CBS is coupled to four input registers ($A'_W$, $B'_W$, $C'_W$, $D'_W$). In addition, three of the input registers ($A'_W$, $B'_W$, $C'_W$) are coupled to intermediate input registers $A_W$, $B_W$ and $C_W$. During each refresh cycle of the DRAMs on the SIMM, enable ID logic provides a unique 2-bit ID value to the memory controller, thereby forming an ID byte. (The sum of all ID bits from each CBS.) The ID byte identifies the manufacturer of the DRAMs, their size and speed.

In operation, the address of data to be read is provided by the processor (or other device) to the memory controller. The memory controller transmits the address over a memory bus to the SIMMs. Each CBS disposed on each SIMM receives a portion of the address, and amplifies and retransmits the address to the DRAMs. The memory controller issues appropriate control signals to read stored data, and data is provided by the DRAMs to each CBS. The data provided to each CBS is sequentially stored (in 4-bit groups) into registers $A_R$, $B_R$, $C_R$ and $D_R$, such that as soon as data is present in register $A_R$ it is shifted out onto the memory bus. Once data in register $A_R$ is shifted out, the counter and decoder logic selects the multiplexor such that data stored in registers $B_R$, $C_R$ and $D_R$ is shifted through register $A_R$ and out onto the memory bus.

In the case of a write operation, the address and data to be stored in the DRAMs is provided to the memory controller over the system bus, the memory controller transmits the address and data to each SIMM on the memory bus. Upon receiving a portion of the full address, each CBS disposed on each SIMM amplifies and retransmits the address over the address and control bus to the DRAMs. The data to be stored is received (in 4-bit groups) by each CBS, over the memory bus, through an input buffer which is enabled by the counter and decode logic. The received data is sequentially stored in registers $A'_W$, $B'_W$, $C'_W$ and $D'_W$. Once data is stored in register $D_W$, data stored in registers $A'_W$, $B'_W$, and $C'_W$ is shifted into intermediate registers $A_W$, $B_W$ and $C_W$. Thereafter, the data is again shifted out in parallel onto the data bus to the DRAMs for storage.

DETAILED DESCRIPTION OF THE INVENTION

An improved single in-line memory module (SIMM) employing dynamic random access memories (DRAMs) is disclosed having particular application for use by a digital computer for storing and retrieving data and programs. In the following description for purposes of explanation, numerous details are set forth such as specific memory sizes, bandwidths, data paths, etc. in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

Figure 1:
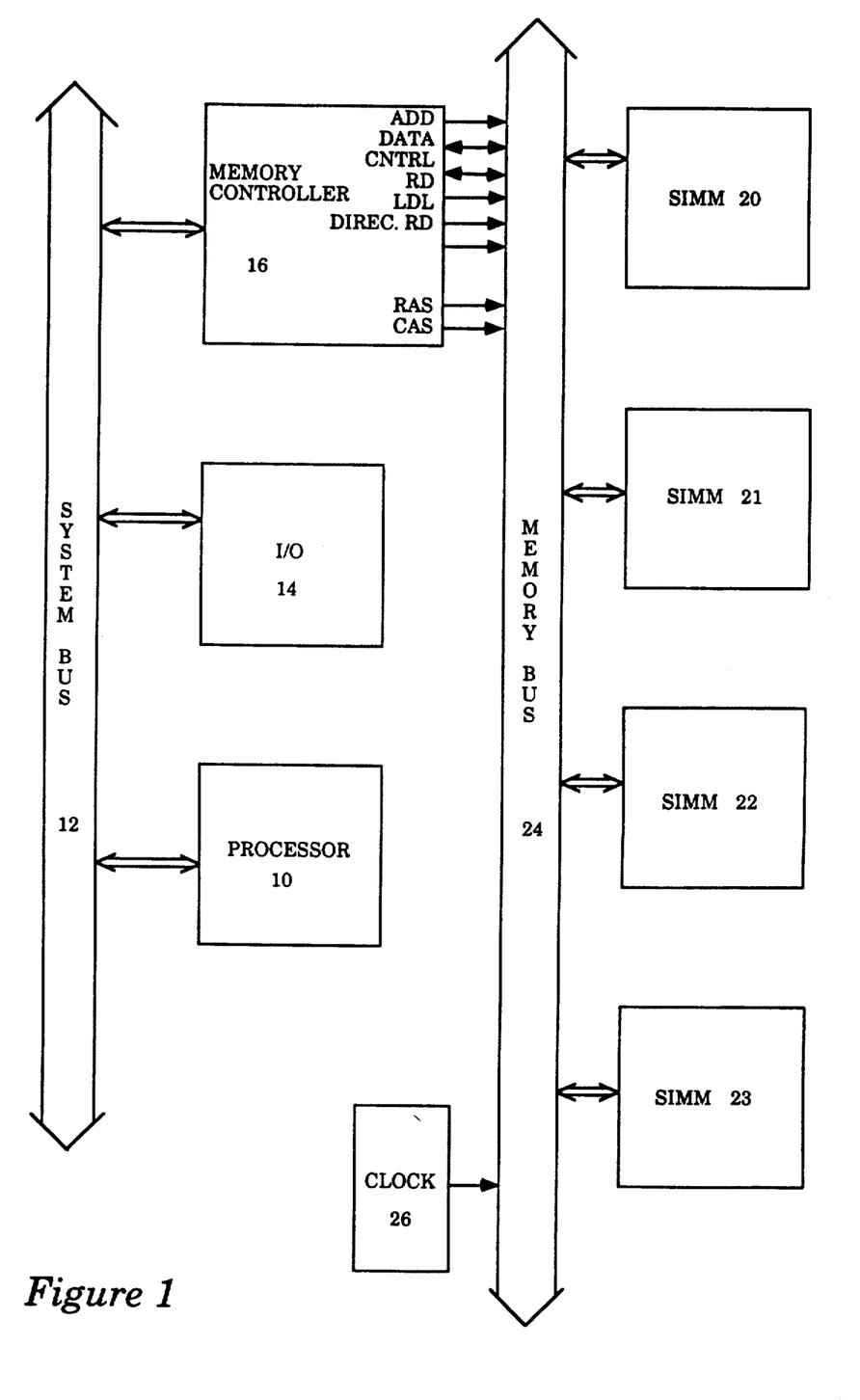
FIG. 1 is a functional block diagram of a typical data processing system employing the teachings of the present invention.

Referring now to FIG. 1, one possible computer system in which the teachings of the present invention may be utilized is illustrated. A processor 10 is coupled to a system bus 12 for communicating with various system components, including input/output devices 14, as well as a memory controller 16 which is also coupled to the system bus 12. As will be described more fully below, processor 10 stores and retrieves data, which may comprise programs and/or alphanumeric and other data in single in-line memory modules (SIMMs) 20, 21, 22, and 23. As illustrated, SIMMs 20 through 23 communicate with the memory controller 16 over a memory bus 24. In addition, a clock 26 provides timed digital clock signals over memory bus 24 to the SIMMs 20 through 23. Although FIG. 1 illustrates four single in-line memory modules coupled to memory bus 24, it will be appreciated by one skilled in the art that the present invention may be used with various numbers of SIMMs coupled to the memory bus 24.

In operation, processor 10 stores data in dynamic random access memory (DRAM) disposed within each of the SIMMs 20 through 23. Data to be stored by processor 10 is provided to the memory controller 16 over the system bus 12. The memory controller then couples the address of the data storage locations in the SIMMs to the memory bus 24, along with the data to be stored. As will be described, various control signals are provided by the memory controller 16 to accomplish storage as well as the retrieval of data in the SIMMs. In addition, it should be noted that row address and column address strobes for DRAMs disposed in the SIMMs are provided by the memory controller 16, and other timing signals associated with the storage and retrieval of data in the SIMMs are also provided by the memory controller 16. Accordingly, the present invention's single in-line memory module may utilize dynamic random access memory having a variety of storage capabilities, since all timing signals originate from the memory controller 16.

In the presently preferred embodiment, SIMMs 20 through 23 are utilized in a memory system with a data transfer size of 64 data bytes for each transaction. In addition, 8 error check bits are provided for each 64 bits of data. Each SIMM (20 through 23) supplies 16 bits of data and 2 bits for error checking. In the presently preferred embodiment, four SIMMs are utilized to supply 72 bits for one data transfer transaction. Currently, the DRAMS utilized by the present invention, which are disposed in SIMMs 20 through 23, operate using a 100 nanosecond access rate, and two consecutive accesses are required to get 64 bytes of data. However, utilizing the present invention's cross bar switch (CBS) on each SIMM, a translation of the 32 bytes at 100 nanoseconds results in an actual data transfer rate of 8 bytes at 25 nanoseconds over the memory bus 24 to the controller 16.

Figure 2:
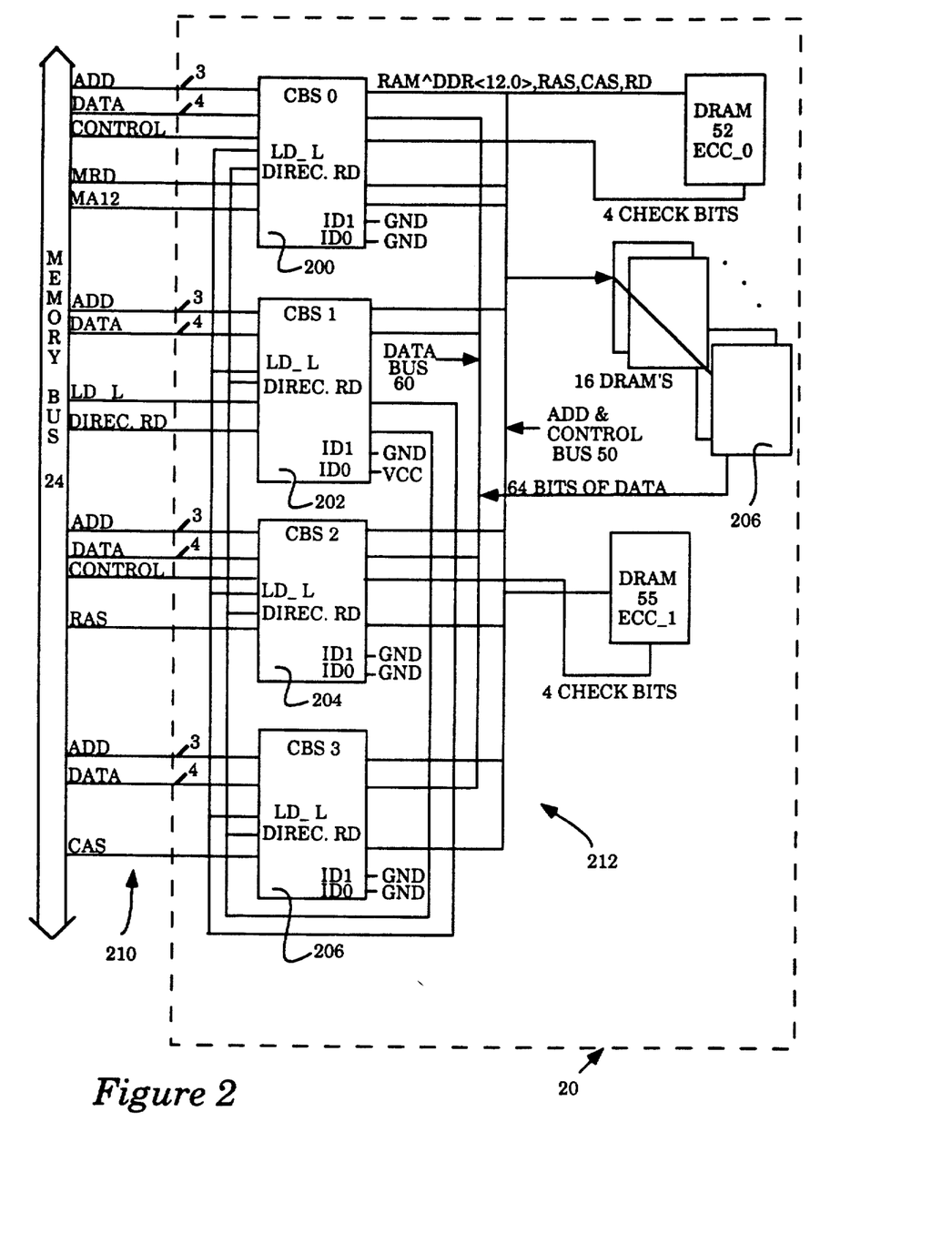
FIG. 2 is a functional block diagram illustrating the present invention's cross bar switches (CBS) disposed within each single in-line memory module (SIMM).

Referring now to FIG. 2, each SIMM (20 through 23), illustrated in FIG. 1, comprises sixteen DRAMs coupled to four cross bar switches (CBSs) including CBS0, CBS1, CBS2, and CBS3, as shown in FIG. 2. Each SIMM (for example SIMM 20 as shown in FIG. 2) includes four cross bar switches (CBS0 through CBS3), wherein each cross bar switch is coupled to the memory bus 24 as illustrated. Sixteen dynamic RAMs (DRAMs) are coupled to an address and control bus 50, and provide, a total of 64 bits of data to a data bus 60, as shown. In addition, two DRAMs, shown in FIG. 2 as DRAM 52 and DRAM 55, each provide four error checking bits to two of the cross bar switches (in the case illustrated in FIG. 2, DRAM 52 provides four check bits to CBS0, and DRAM 55 provides four check bits to CBS2). As illustrated, data provided by the sixteen DRAMs is coupled to data bus 60, and thereby provided to each of the cross bar switches and ultimately transmitted on memory bus 24. In the presently preferred embodiment, each CBS comprises an ASIC, however, it will be appreciated that the cross bar switches may also be fabricated using standard cell, custom or semi-custom fabrication techniques. In FIG. 2, cross bar switches CBS0, CBS1, CBS2, and CBS3 are identified by reference numerals 200, 202, 204, and 206, respectively. The 16 DRAM's are identified by reference numeral 208. Signal transmission paths between memory buffers 24 and cross bar switches 200, 202, 204, and 206 are generally identified by reference numeral 210. Signal transmission lines interconnecting the cross bar switches with the DRAM modules are generally denoted by reference numeral 212. Individual signal transmission paths within 210 and 212 are identified by the control signals or data signals transmitted over the lines, in accordance with conventional computer nomenclature.

In the preferred embodiment, each SIMM (see FIG. 1) provides 16 bits of data, such that the sum of the output of SIMMs 20 through 23 provide a total of 64 bits of data, which comprises one "word" in the computer system. In addition, each SIMM (20 through 23) provides two bits of error check bits, thereby resulting in an eight bit error check byte. Of the sixteen bits of data provided by each SIMM, each cross bar switch (see FIG. 2) contributes four bits of data, and as illustrated in FIG. 2, each cross bar switch provides four data lines to the memory bus 24, and is also coupled to the memory bus 24 by three address lines. The operation of each cross bar switch within the SIMM will be described more fully below.

In operation, processor 10 provides an address to read data from, or write data into, SIMMs 20 through 23. The address is coupled over the memory system bus 12 to the memory controller 16. The memory controller 16 couples the address to the memory bus 24, which, depending on the bit value of the address, parses the address bits (presently three bits at a time) to each of the respective cross bar switches on each of the SIMMs (see FIG. 2). As will be described, each cross bar switch amplifies the address, and couples its portion of the address to the address and control bus 50, such that the address bits are provided to the 16 DRAMs of FIG. 2. Addresses associated with DRAM 52 or DRAM 55 for error checking are similarly coupled to the appropriate DRAM through either CBS0 or CBS2, as illustrated in FIG. 2. In the presently preferred embodiment, the error detection and correction method used is known as "single bit error correction/double bit error detection/single-4-bit byte error detection" (SEC-DED-S4ED). However, it will be appreciated by one skilled in the art that a variety of error detection and correction mechanisms may be utilized in accordance with the teachings of the present invention. In addition, in the present embodiment error detection and correction is accomplished by memory controller 16, although, in other applications processor 10 may be used for these functions.

Figure 3:
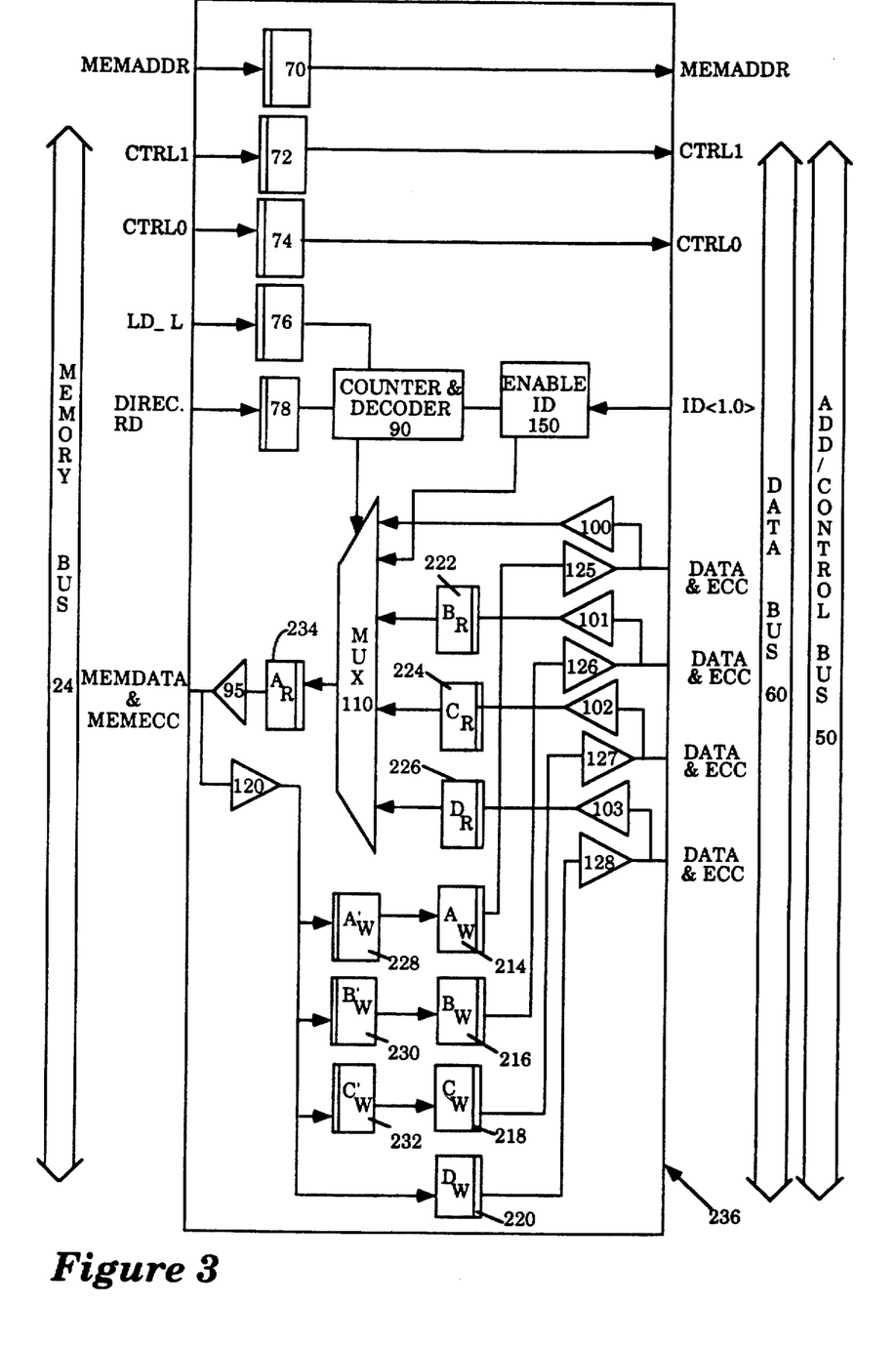
FIG. 3 is a functional block diagram of each cross bar switch utilized by the present invention.

Referring now to FIG. 3, each cross bar switch (CBS) is comprised of the elements illustrated. As shown, three lines comprising a three bit memory address (MEMADDR) is coupled from the memory bus 24 into a memory address register 70. Similarly, two lines of memory control (illustrated as a single line into each CBS of FIG. 2) are coupled, respectively, to registers 72 and 74. An LD_L control line is also coupled to the memory bus 24, and provides signals to initiate a memory access cycle, and as illustrated in FIG. 3, the LD_L line is coupled to a register 76. A direction read (Direc.RD) line provides signals which designate operations as either read or write operations into the DRAMs. The direction read signal is provided over a Direc.RD line coupled to the memory bus 24, and as shown, the line is coupled to register 78. In FIG. 3, the $A_W$, $B_W$, $C_W$, and $D_W$, registers are identified by reference numerals 214, 216, 218, and 220, respectively. Registers $B_R$, $C_R$, and $D_R$, are identified by reference numerals 222, 224, and 226. Registers $A'_W$, $B'_W$, and $C'_W$, are identified by reference numerals 228, 230, and 232. Register $A_R$, is identified by reference numeral 234. Transmission paths interconnecting memory BUS 24, data BUS 60 and the various registers and multiplexers illustrated in FIG. 3 are generally identified by reference numeral 236. Individual transmission lines are identified by the signals transmitted thereon, in accordance with conventional computer nomenclature.

In operation, the CBS receives a memory address (MEMADDR) corresponding to an address in one of the SIMM DRAMs, over memory bus 24. The address and memory control signals (CTRL1 and CTRL0) are received by each CBS, and stored in register 70, 72, and 74, respectively. The CBS amplifies and retransmits the memory address to the address and control bus 50 (see FIGS. 2 and 3).

Figure 5:
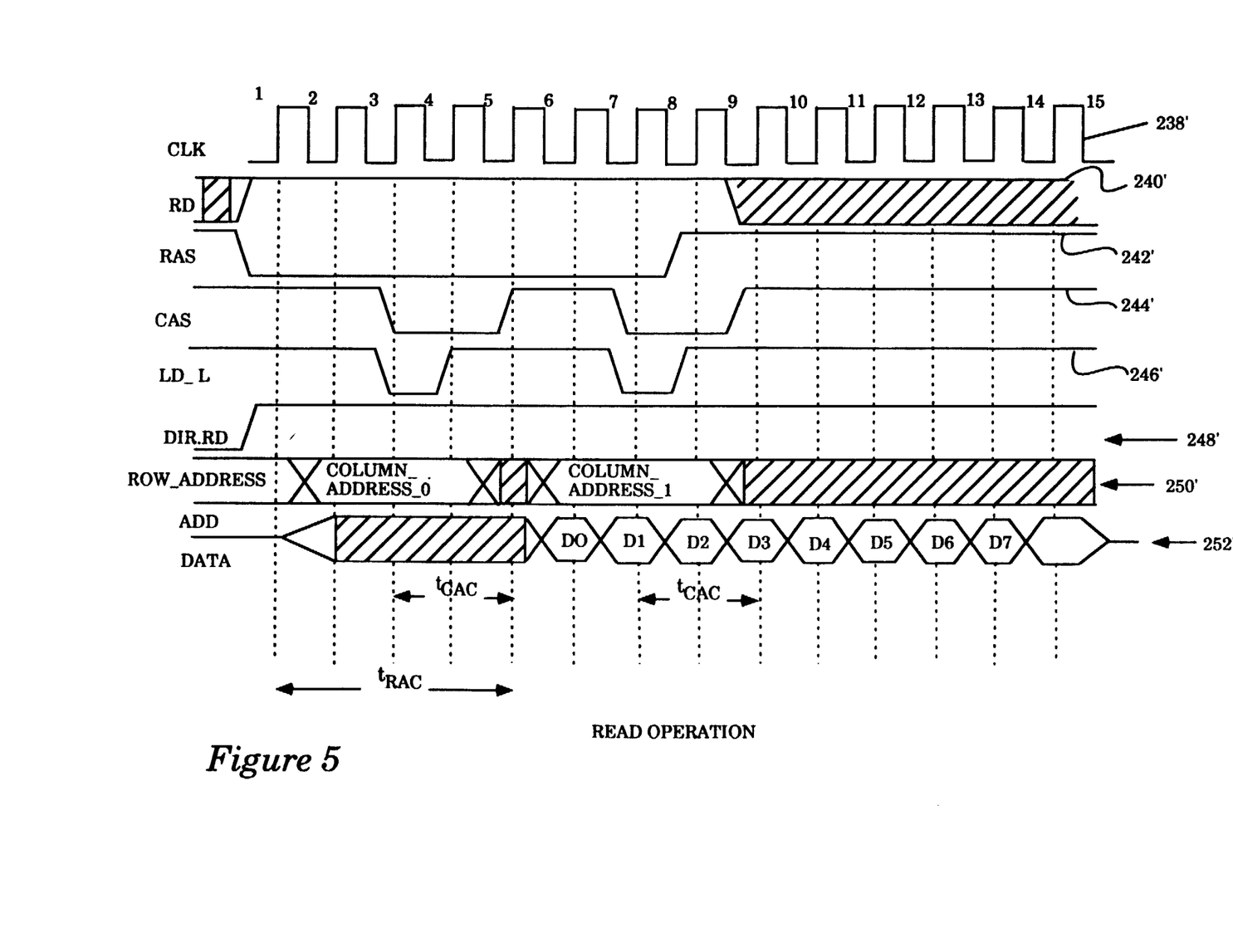
FIG. 5 is a timing diagram of various signals employed by the present invention during a read operation.

Assume for sake of example that the processor 10 initiates a read operation to retrieve data stored in SIMMs 20 through 23. Processor 10 applies the address (MEMADDR) of the stored data to system bus 12, and the address is received by memory controller 16 which applies it to the memory bus 24. As previously described, within each SIMM are disposed four cross bar switches. Each CBS within the respective SIMM receives three bits of the address along with control signals (including row address strobe (RAS) and column address strobe (CAS) signals) which are stored in register 70, 72 and 74, respectively. The address (MEMADDR) is shifted out of register 70 in each CBS and onto the address and control bus 50, which is in turn coupled to the dynamic RAMs (see FIG. 2). As best illustrated in FIG. 5, the timing of the various signals applied to the CBS is such that the memory controller 16 applies a Direc.RD signal (high) to each CBS. The Direc.RD signal is stored in register 78.

As shown in FIG. 3, a counter and decoder circuit 90 is coupled to both register 76 as well as register 78. Generally concurrent with the application of the Direc.RD signal, the memory controller 16 applies a LD_L signal (low) to register 76. The LD_L and Direc.RD signals are received by the counter and decoder 90. In a read operation, the counter and decoder 90 enables an output buffer 95, and latches data read from the DRAMs, and provided over data bus 60, into buffers 100, 101, 102 and 103, along with the respective error checking and correction bits (ECC). The retrieved data is then latched into buffers 100 through 103 after a predetermined number of cycles. Reference is made to the timing diagram of FIG. 5 for the particular sequence of signals, including RAS, CAS, LD_L and Direc.Rd signal sequence utilized by the present invention.

The counter and decoder 90 further controls multiplexer 110, such that once data read from the DRAMs is received in buffers 100 through 103, the following steps occur: Immediately upon receiving the first four bits of data in buffer 100, the data in buffer 100 is transferred through the multiplexer 110, and stored in register $A_R$. Then, sequentially as data is received in buffers 101, 102 and 103, the corresponding data is stored is registers $B_R$, $C_R$, and $D_R$. Substantially concurrent with the receipt of data in register $A_R$, the four bits of data stored in register $A_R$ are shifted out over MEM DATA lines, in parallel to the memory bus 24. Once the data bits stored in register $A_R$ are shifted through the output buffer 95, multiplexer 110, as controlled by counter and decoder 90, sequentially selects registers $B_R$, $C_R$, and $D_R$ such that the contents of these registers are also shifted out onto the memory bus 24 through the output buffer 95. In addition to the four bits of data shifted through output buffer 95 in each CBS in a SIMM, an additional one error checking bit (ECC) is also provided. It will be appreciated from the previous discussion of the structure and operation of each SIMM, that the 16 bits of data outputted from each CBS form a 64 bit data word along with an 8 check bits (ECC).

Figure 4:
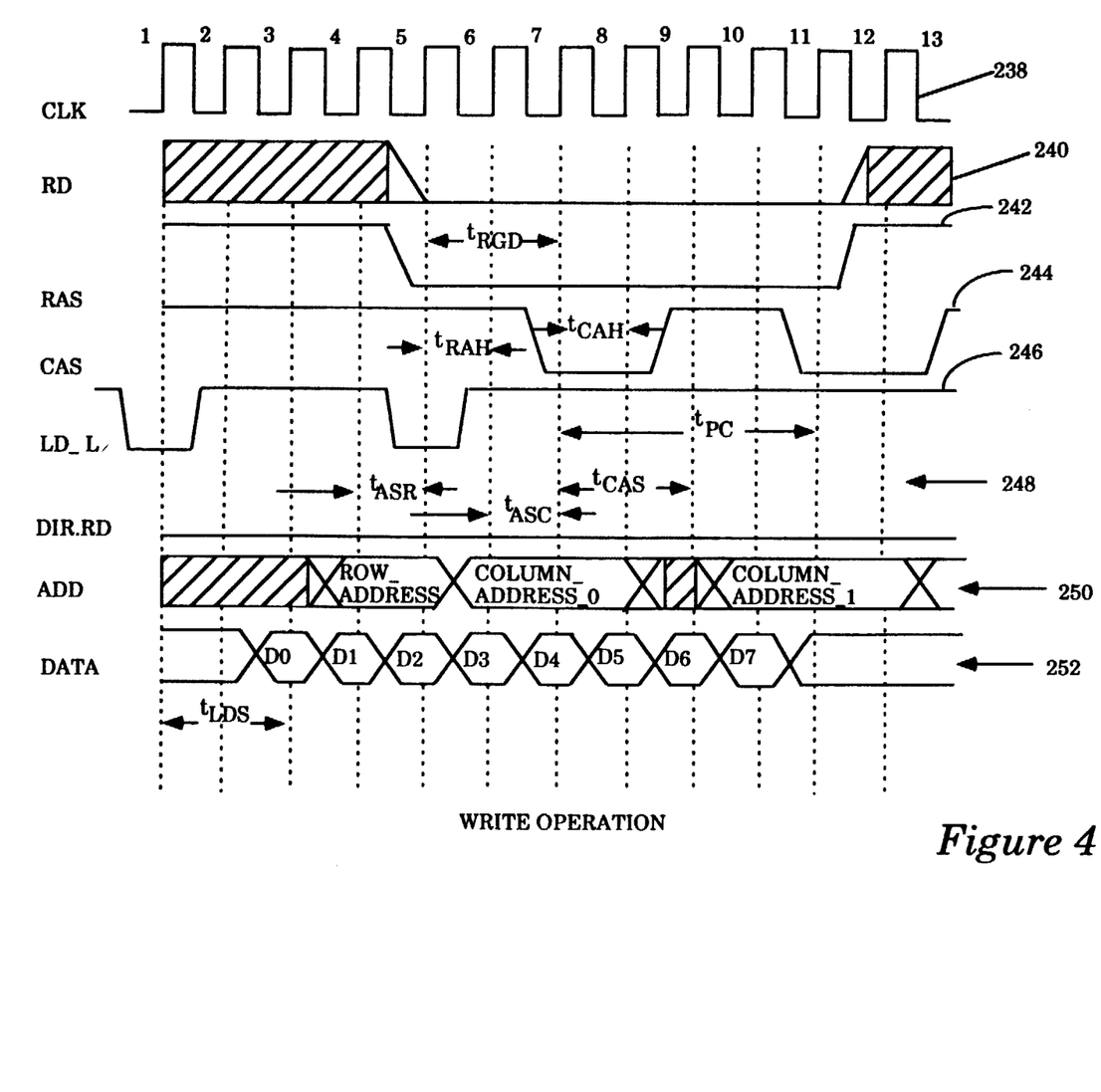
FIG. 4 is a timing diagram which illustrates a sequence of various signals employed by the present invention during a write mode.

Referring once again to FIGS. 2, 3 and 4, the sequence of operations executed by the present invention will be described with respect to writing data into DRAMs disposed in each SIMM. In the event that processor 10, or other I/O device, writes data into the SIMM memory array, the data as well as address of the storage location within the DRAM memory is coupled to the memory controller 16 through bus 12. Memory controller 16 applies the address for the data to be written to the memory bus 24, which is in turn coupled to SIMMs 20 through 23. In addition, the memory controller 16 applies control signals (RAS and CAS) to the memory bus 24, which are received by each CBS in the respective SIMMs. As in the case of a read operation, three bits of the address are received by each CBS disposed on a SIMM along with two control bits, CTRL1 and CTRL0. Each CBS clocks the address and control bits into registers 70, 72 and 74, respectively, and then amplifies and retransmits these signals to the DRAMs over address and control bus 50. As illustrated best in FIGS. 3 and 4, the memory controller 16 maintains the Direc.Rd line in a low state, and provides an LD_L pulse to begin the write operation. Upon the receipt of the LD_L signal, counter and decoder 90 disables the output buffer 95 and enables an input buffer 120. The data to be stored is then applied by memory controller 16 to the memory bus 24, and for each CBS, four bits are provided (plus one ECC check bit) serially to the input buffer 120. Each CBS (see FIG. 3) progressively stores each four bit group of data in registers $A'_W$, $B'_W$, and $C'_W$, however, the fourth cycle to be received is stored directly in register $D_W$. When the last group of four bits of data are stored in register $D_W$, CBS shifts data stored in $A'_W$, $B'_W$, and $C'_W$ into registers $A_W$, $B_W$, and $C_W$, respectively. Once shifted into these registers, the data immediately appears on the output of the data and control bus 50, through buffers 125, 126, 127, and 128. Reference is made to FIG. 4 for an identification of the various signals and sequences of signals provided by memory controller 16, in order to accomplish a write operation using the present invention. Specifically, FIG. 4 illustrates a clock signal (CLK) 238, an RD signal 240, a row address strobe signal (RAS) 242, and a column address strobe signal (CAS) 244. FIG. 4 also illustrates and LD_L signal, 246, a DIR.RD signal 248, an ADD signal 250, and a DATA signal 252. Individual portions of the various signals are identified in FIG. 4 by conventional computer nomenclature. FIG. 5 illustrates signals corresponding to those of FIG. 4, but for a read operation rather than a write operation. The signals illustrated in FIG. 5 are identified by the same reference numerals as those of FIG. 4, with primes attached.

Referring to FIGS. 2 and 3, the present invention's use of an ID number to identify the vendor of the particular DRAMs, along with the size and speed of the DRAMs, is reported as part of an eight bit identification byte. In the event a Direc.RD signal is applied to register 78 and counter and decoder 90 without a corresponding LD_L pulse, the counter and decoder 90 signal enable ID logic circuitry 150, which couples a two bit ID value to each CBS. The two bit ID value is determined by hard wiring each of the bit lines either to ground or to Vcc (see FIG. 2). This two bit ID value is coupled through multiplexer 110, and shifted through register $A_R$, and output buffer 95, onto the memory bus 24 as data. It will be appreciated since there are four CBS devices on each SIMM, that since each CBS reports two bits of the ID byte, that a total of eight bits are reported for each SIMM.

Figure 6:
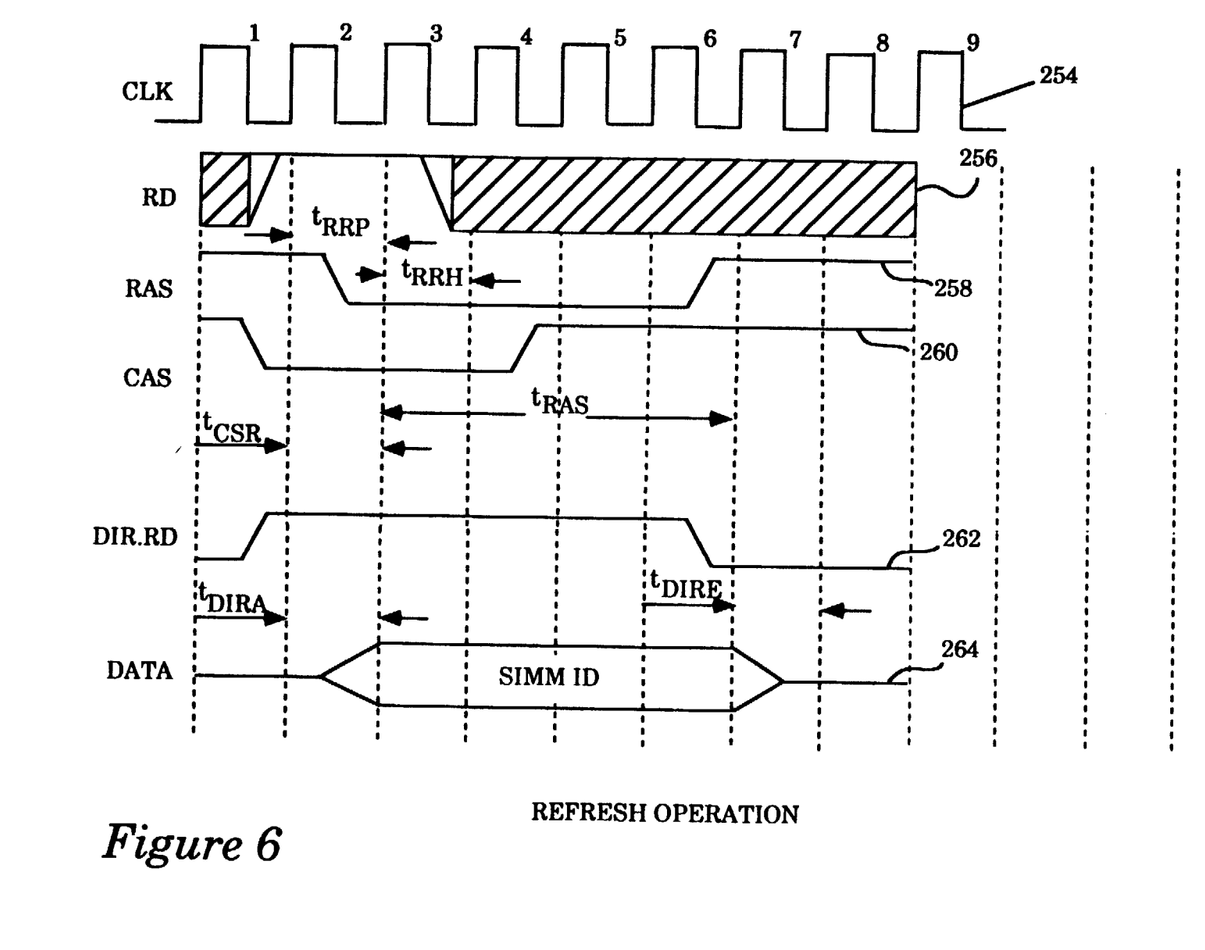
FIG. 6 is a timing diagram illustrating the sequence of operations utilized by the present invention during a refresh operation.

With reference to FIG. 6, in the presently preferred embodiment memory controller 16 initiates a refresh mode which is required in accordance with the particular DRAMs utilized in the SIMM. The present invention incorporates circuitry such that each time the memory controller 16 generates a refresh cycle, the ID byte is coupled onto the memory bus data lines as described above. The use of the identification byte by the present invention permits various types of DRAMs to be incorporated in the SIMMs without the need to redesign either the SIMM architecture or CBS. In addition, no specific timing circuitry need be provided in the CBS, since all timing is completed through the memory controller 16 based on the type of DRAMs utilized as reported by the ID byte. FIG. 6 illustrates the timing of various signals employed in the refresh operation. Specifically, FIG. 6 illustrates a clock signal (CLK) 254, an RD signal 256, a RAS signal 258, a CAS signal 260, a DIR.RD signal 262, and a data signal 264. Portions of the various signals are identified in FIG. 6 with conventional computer nomenclature.

Figure 7:
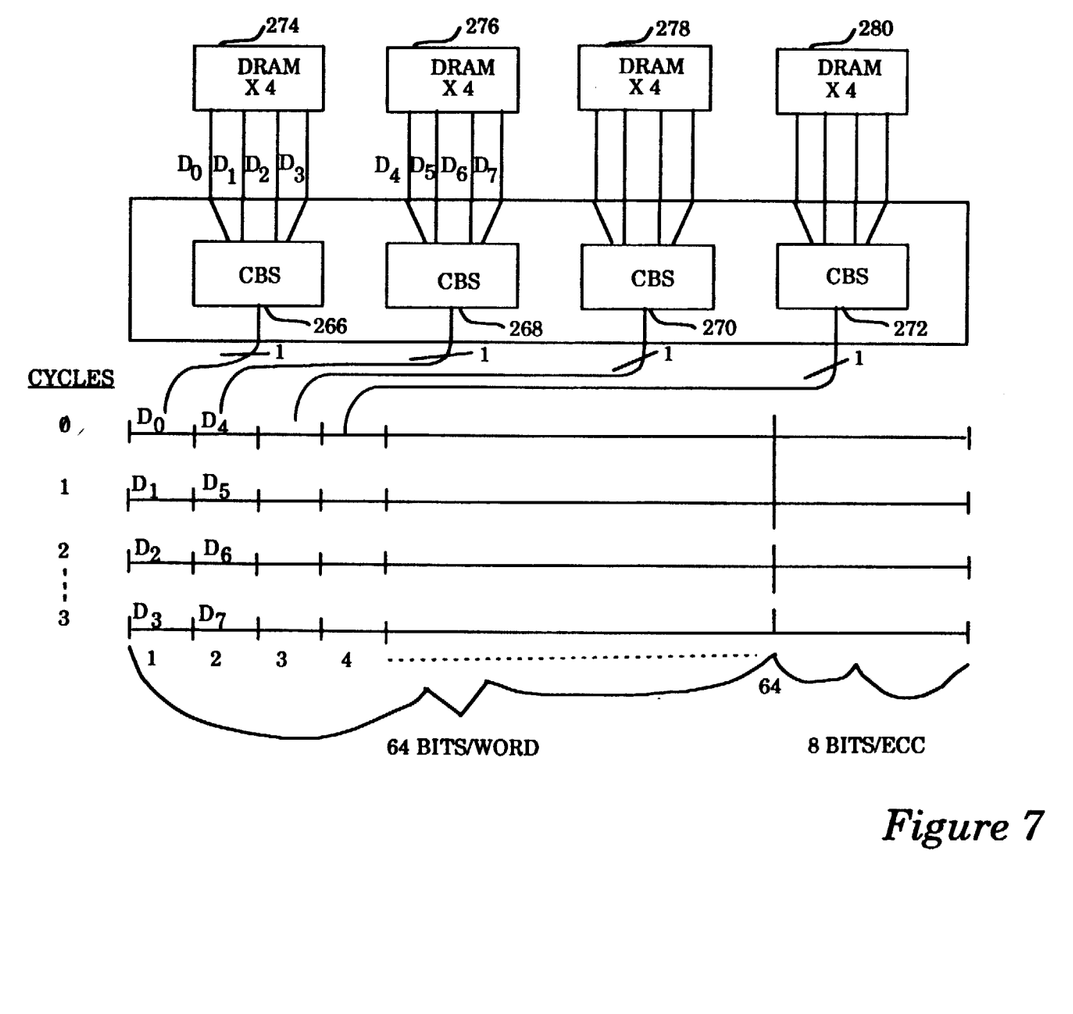
FIG. 7 conceptually illustrates the present invention's use of bit scattering to minimize data loss in the event of a DRAM malfunction.

Referring now to FIG. 7, the present invention's use of bit scattering to minimize data loss in the event of a DRAM malfunction is described. As best shown in the figure, for each 64 bit word provided by each SIMM in the system illustrated in FIG. 1, each bit comprising the 64 bit word originates from a different DRAM. As previously described, each DRAM provides 4 bits of data, however, the present invention requires that on each cycle only one bit of data and one check bit is provided by a DRAM. In addition, as shown in FIG. 7, it will be appreciated that for each 64 bit word, in each cycle, the same bit is provided by each DRAM. Accordingly, in the event of a DRAM malfunction, only one bit of data per cycle is lost. The loss of one bit per cycle due to a defective DRAM does not constitute a fatal error condition, and in accordance with the teachings of the present invention, the error would be detected and easily corrected by the memory controller 16. The structure illustrated in FIG. 7 may be contrasted with an architecture wherein a single DRAM provides 4 bits of sequential data for the same word. It will be appreciated, that in such event, the loss of the DRAM will result in the loss of 4 bits out of 64 bits. The loss of a 4 bit group out of a 64 bit word could prove fatal and nonrecoverable. Accordingly, the present invention's bit scattering structure shown in FIG. 7 minimizes data loss in the event of a malfunction and maximizes the probability of error correction once an error is detected. In FIG. 7, four cross bar switches 266, 268, 270, and 272 are illustrated in connection with the four sets of DRAM modules, 274, 276, 278, and 280 respectively. Timing cycles O-N are also represented.

While the present invention has been particularly described with reference to FIGS. 1 through 7 and with emphasis on certain memory system architectures, it should be understood that the figures are for illustration only and should not be taken as limitations upon the invention. In addition, it is clear that the methods and apparatus of the present invention have utility in any application wherein data processing system accesses multiple data planes or generates multibit words. It is contemplated that many changes and modifications may be made, by one of ordinary skill in the art, without departing from the spirit and scope of the invention as disclosed above.

We claim:

1. A data processing system, comprising:
   memory controller means for providing memory address, data and control signals; and
   a plurality of memory modules coupled to said memory controller means, each of said modules including:
   a plurality of memory devices for storing and retrieving data;
   a plurality of cross bar switches, (CBS) with each of said cross bar switches coupled to said memory controller means and to at least two corresponding memory devices, said cross bar switches receiving portions of a memory address provided by said memory controller means and providing said address portions to respective corresponding memory devices, said memory address identifying a location of corresponding data, said memory address portion identifying a location of a portion of said corresponding data, each of said CBS further including input/output means for sequentially providing said portion of said data corresponding to said portion of said memory address from said memory controller means to said corresponding memory devices, and for sequentially receiving said portion of said data from said corresponding memory devices for transfer to said memory controller means;

wherein each of said cross bar switches is coupled to said corresponding memory device over a data and an address/control bus;

wherein in the event of a read operation, upon the receipt of first predefined control signals from said memory controller means, each of said CBS receives said portion of data from said corresponding memory devices and provides said received portions of data to said memory controller means;

wherein in the event of a write operation, each of said CBS receives said portion of data to be stored from said memory controller means and upon receipt of second predefined control signals from said memory controller means, said CBS stores said portion of data in said corresponding memory devices; and wherein each CBS includes:
first input register means coupled to said data bus for receiving data from said corresponding memory devices;
counter and decoder means;
multiplexor means coupled to said first input register means and to said counter and decoder means, said multiplexor shifting said received data in said first input register means out to said memory controller means upon the receipt of multiplexor control signals from said counter and decoder means.

2. The data processing system as defined by claim 1, wherein said CBS further includes:
second input register means for receiving from said memory controller means data to be stored in said corresponding memory devices.

3. The data processing system as defined by claim 2, wherein said second input register means includes registers $A'_w$, $B'_w$, $C'_w$ and $D_w$, and wherein registers $A'_w$, $B'_w$, $C'_w$ are coupled, respectively, to intermediate registers $A_w$, $B_w$, $C_w$, such that data provided by said memory controller means to be stored in said predefined memory device is sequentially stored in N bit groups in each of said registers $A'_w$, $B'_w$, $C'_w$ and $D_w$ and once in N bits of data are stored in register $D_w$, data previously stored in registers $A'_w$, $B'_w$ and $C'_w$ is shifted into registers $A_w$, $B_w$, and $C_w$ and then coupled to said data bus to said corresponding memory devices.

4. The data processing system as defined by claim 2, wherein said first input register means includes registers $A_r$, $B_r$, $C_r$ and $D_r$, wherein register $A_r$ is coupled to the output of said multiplexor means and registers $B_r$, $C_r$ and $D_r$ are coupled between said data bus and the input of said multiplexor means, such that data received from said corresponding memory devices over said data bus is sequentially stored, in N bit groups, in registers $A_r$, $B_r$, $C_r$ and $D_r$.

5. The data processing system as defined by claim 4, wherein said data stored in register $A_r$ is shifted out to said memory controller means and said multiplexor means then sequentially shifts out data stored in said registers $B_r$, $C_r$ and $D_r$ to said memory controller means.

6. The data processing system as defined by claim 5, wherein said plurality of memory devices are coupled to said memory controller means through said cross bar switches over a memory bus.

7. The data processing system as defined by claim 6, wherein said plurality of memory devices comprise 16 dynamic random access memory (DRAM) devices.

8. The data processing system as defined by claim 7, wherein said memory modules each contain 4 cross bar switches.

9. The data processing system as defined by claim 8, wherein each CBS amplifies and retransmits said portion of a memory address to said corresponding memory devices over said address/control bus.

10. The data processing system as defined by claim 9, wherein each CBS receives an address portion comprising three bits.

11. The data processing system as defined by claim 9, wherein said control signals provided by said memory controller means includes row and column address strobe signals for said DRAMs.

12. The data processing system as defined by claim 11, wherein said memory controller means is coupled to a processor over a system bus.

13. The data processing system as defined by claim 12, wherein four memory modules are coupled to said memory bus, each of said memory modules having 16 DRAMs.

14. The data processing system as defined by claim 8, wherein each of said memory modules further includes two DRAMs for storing error check bits (ECC), such that for each 4 bits of data provided to a CBS, 1 error check bit is provided.

15. The data processing system as defined by claim 14, wherein each CBSA outputs 16 bits which form a 64 bit data word for said data processing system.

16. The data processing system as defined by claim 15, wherein each bit comprising said 64 bit word is provided by a different DRAM, such that for each read operation only one bit of data and one check bit is provided per DRAM.

17. The data processing system as defined by claim 2, further including enable ID means coupled to said counter and decoder means for storing an x bit identifier.

18. The data processing system as defined by claim 17, wherein upon the receipt of a predetermined signal by said counter and decoder means, said counter and decoder means couples said x bit identifier to said memory controller means.

19. The data processing system as defined by claim 18, wherein said predetermined signal is provided by said memory controller means.

20. The data processing system as defined by claim 18, wherein said predetermined signal is provided by a processor coupled to said memory controller means.

21. The data processing system as defined by claim 18, wherein said x bit identifier comprises a 2 bit value for each CBS.

22. The data processing system as defined by claim 21, wherein a complete identification value comprises 8 bits, 2 bits provided by each CBS.

23. The data processing system as defined by claim 18, wherein said x bit identifier is coupled through said multiplexor means and said $A_r$ register to said memory controller means.

24. The data processing system as defined by claim 21, wherein said enable ID means is coupled to two 1 bit lines such that said 2 bit value is determined by hard wiring each of said bit lines to either ground or a voltage source.

25. The data processing system as defined by claim 21, wherein said x bit identifier identifies the manufacturer, size and speed of said memory devices.

26. The data processing system of claim 1, wherein each of said portions of said data comprises one bit of data, such that individual bits of the data are stored sequentially in a plurality of memory devices.

27. The data processing system of claim 1, wherein portions of data stored in respective memory devices include bits which, when taken together, identify attributes of the respective memory device.

28. The data processing system of claim 27, wherein said attributes include the manufacture, size and speed of the memory devices.

29. A data processing system, comprising:
memory controller means for providing memory addresses, data and control signals;
a plurality of memory modules coupled to said memory controller means, each of said modules including:
a plurality of memory devices for storing and retrieving data;
a plurality of cross bar switches (CBS), with each of said cross bar switches coupled to said memory controller means and to at least two corresponding memory devices, said cross bar switches receiving portions of a memory address provided by said memory controller means and providing said address portions to respective corresponding memory devices, said memory address identifying a location of corresponding data, said memory address portion identifying a location of a portion of said corresponding data, each of said CBS further including input/output means for sequentially providing said portion of said data corresponding to said portion of said memory address from said memory controller means to said corresponding memory device, and for sequentially receiving said portion of said data from said corresponding memory device for transfer to said memory controller means;
wherein said plurality of memory devices comprise 16 dynamic random access memory (DRAM) devices, with said memory modules each containing 4 cross bar switches;
wherein each of said memory modules further includes two DRAMs for storing error check bits (ECC), such that for each 4 bits of data provided to a CBS, 1 error check bit is provided; and
wherein each CBS outputs 16 bits which form a 64 bit data word for said data processing system; with each bit of said 64 bit word provided by a different DRAM, such that for each read operation only one bit of data and one check bit is provided per DRAM.

30. A data processing system, comprising:
memory controller means for providing memory addresses, data and control signals;
a plurality of memory modules coupled to said memory controller means, each of said modules including:
a plurality of memory devices for storing and retrieving data;
a plurality of cross bar switches (CBS), with each of said cross bar switches coupled to said memory controller means and to at least two corresponding memory devices, said cross bar switches receiving portions of a memory address provided by said memory controller means and providing said address portions to respective corresponding memory devices, said memory address identifying a location of corresponding data, said memory address portion identifying a location of a portion of said corresponding data, each of said CBS further including input/output means for sequentially providing said portion of said data corresponding to said portion of said memory address from said memory controller means to said corresponding memory device, and for sequentially receiving said portion of said data from said corresponding memory device for transfer to said memory controller means;
wherein each of said cross bar switches includes
first input register means coupled to said data bus for receiving data from said memory devices;
multiplexor means coupled to said input register means and to counter and decoder means, said multiplexor shifting said received data out to said memory controller means upon the receipt of multiplexor control signals from said counter and decoder means; and
second input register means for receiving from said memory controller means data to be stored in said predefined memory device;
wherein an enable ID means is coupled to said counter and decoder means for storing an x bit identifier;
wherein upon the receipt of a predetermined signal by said counter and decoder means, said counter and decoder means couples said x bit identifier to said memory controller means; and
wherein said predetermined signal is provided by a processor coupled to said memory controller means, said x bit identifier comprises a 2 bit value for each CBS, a complete identification value comprising 8 bits, with 2 bits provided by each CBS, said x bit identifier is coupled through said multiplexor means and said $A_r$ register to said memory controller means, said enable ID means is coupled to two 1 bit lines such that said 2 bit value is determined by hard wiring each of said bit lines to either ground or a voltage source, and said x bit identifier identifies the manufacturer, size and speed of said memory devices.

* * * * *